(12) United States Patent
Abd Mutholib et al.

(10) Patent No.: US 12,354,896 B2
(45) Date of Patent: Jul. 8, 2025

(54) WAFER CONTAINER AND SIZE ADAPTION SYSTEM THEREFOR

(71) Applicant: ENTEGRIS, INC., Billerica, MA (US)

(72) Inventors: Mohamad Zakaria Abd Mutholib, Kulim (MY); Gian Ping Chua, Kulim (MY); Sin Ghun Lim, Butterworth (MY)

(73) Assignee: ENTEGRIS, INC., Billerica, MA (US)

( * ) Notice: Subject to any disclaimer, the term of this patent is extended or adjusted under 35 U.S.C. 154(b) by 112 days.

(21) Appl. No.: 18/030,041

(22) PCT Filed: Oct. 4, 2021

(86) PCT No.: PCT/US2021/053382
§ 371 (c)(1),
(2) Date: Apr. 3, 2023

(87) PCT Pub. No.: WO2022/072929
PCT Pub. Date: Apr. 7, 2022

(65) Prior Publication Data
US 2023/0360941 A1 Nov. 9, 2023

Related U.S. Application Data

(60) Provisional application No. 63/086,960, filed on Oct. 2, 2020.

(51) Int. Cl.
*H01L 21/673* (2006.01)
(52) U.S. Cl.
CPC ............................ *H01L 21/67369* (2013.01)

(58) Field of Classification Search
CPC .......... H01L 21/67383; H01L 21/6732; H01L 21/67369
USPC ................. 206/454, 521–594, 710–712, 832
See application file for complete search history.

(56) References Cited

U.S. PATENT DOCUMENTS

| | | | | |
|---|---|---|---|---|
| 4,721,207 | A | * | 1/1988 | Kikuchi ............. G11B 33/0444 206/307 |
| 5,025,924 | A | * | 6/1991 | Watanabe ......... H01L 21/67359 206/711 |
| 5,207,324 | A | * | 5/1993 | Kos ................... H01L 21/67369 206/711 |
| 5,482,161 | A | | 1/1996 | Williams et al. |

(Continued)

FOREIGN PATENT DOCUMENTS

| | | |
|---|---|---|
| JP | H10144755 A | 5/1998 |
| KR | 20100077628 A | 7/2010 |
| WO | 2010003927 A1 | 1/2010 |

*Primary Examiner* — Chun Hoi Cheung

(57) ABSTRACT

A wafer container includes a pod, a door, a wafer cassette with a top wall, a baseplate, and a biasing member. The pod includes side wall(s), a closed end, and an open end. When closed by the door, the baseplate is located between the door and the wafer cassette and the biasing member is compressed between the wafer cassette and the closed end of the pod. A size adaption system for securing a wafer cassette within an internal space of a closed pod includes a baseplate and a biasing member. The baseplate includes at least one of a projection for coupling the baseplate and the wafer cassette and a notch for coupling the baseplate and the door. The biasing member to be disposed in compression between the wafer cassette and a closed end of the pod.

17 Claims, 8 Drawing Sheets

(56) References Cited

U.S. PATENT DOCUMENTS

| | | | | |
|---|---|---|---|---|
| 5,555,981 A * | 9/1996 | Gregerson | H01L 21/67369 | 206/711 |
| 6,041,937 A * | 3/2000 | Wu | H01L 21/67369 | 206/453 |
| 6,848,579 B2 * | 2/2005 | Cleaver | B65D 81/07 | 206/454 |
| 7,510,082 B2 * | 3/2009 | Kimura | H01L 21/67353 | 206/454 |
| 7,578,392 B2 * | 8/2009 | Brooks | H01L 21/67373 | 206/832 |
| 7,942,269 B2 * | 5/2011 | Lu | H01L 21/67359 | 206/453 |
| 8,393,471 B2 * | 3/2013 | Ochoa | H01L 21/67369 | 206/832 |
| 8,403,143 B2 * | 3/2013 | Chiu | H01L 21/67353 | 206/724 |
| 8,439,197 B2 * | 5/2013 | Yajima | B65D 81/133 | 206/592 |
| 9,184,077 B2 * | 11/2015 | Yang | H01L 21/67369 | |
| 9,321,574 B2 * | 4/2016 | Garner | B65B 61/22 | |
| 2005/0098473 A1 * | 5/2005 | Sheehan, Jr. | H01L 21/67369 | 206/832 |
| 2009/0196714 A1 | 8/2009 | Sylvestre et al. | | |
| 2009/0260329 A1 * | 10/2009 | Ochoa | B65B 5/08 | 53/473 |
| 2013/0010277 A1 | 1/2013 | Del Puerto et al. | | |
| 2013/0056389 A1 | 3/2013 | Gregerson et al. | | |
| 2016/0049319 A1 * | 2/2016 | Thomas | B65D 81/07 | 206/710 |
| 2018/0056291 A1 | 3/2018 | Bores | | |

\* cited by examiner

WAFER CONTAINER AND SIZE ADAPTION SYSTEM THEREFOR

FIELD

This disclosure generally relates to the securing of wafer cassettes in wafer containers. More particular, this disclosure relates a securing of a wafer cassette within a pod of a wafer container.

BACKGROUND

Wafer containers can include a wafer cassette contained with an outer pod. The wafer cassette may move with respect to the rest of the pod when moved or exposed to shocks such as being dropped, bumped, or the like. The movement of the wafer cassette can lead to damage to the pod, cassette, or wafers, or lead to undesirable particle generation. Wafer containers can be configured for containing a particular size of wafer cassette. Each pod can have features specifically configured (e.g., sized, positioned, etc.) for holding one size of wafer cassette. For example, "200 mm" wafer container can include a pod configured for securely containing a "200 mm" wafer cassette (i.e., a wafer cassette sized for holding 200 mm width wafers).

SUMMARY

This disclosure generally relates to securing of a wafer cassette within a pod of wafer container.

By using a baseplate between a door and the wafer cassette and one or more biasing members between the wafer cassette and a closed end of the pod, the wafer container can be adapted to securely hold a smaller sized wafer container within its closed pod by the baseplate and one or more biasing members limiting movement of the wafer cassette relative to the closed pod.

In an embodiment, a wafer container includes a pod, a door, a wafer cassette, a baseplate, and a biasing member. The pod includes one or more side walls, a closed end, an open end, and an internal space defined by the one or more side walls and the closed end. The wafer cassette includes a top wall. The door is configured to close the open end of the pod. When the open end of the pod is closed by the door, the baseplate is located between the door and the wafer cassette, and the biasing member is compressed between the top wall of the wafer cassette and the closed end of the pod and pushes the wafer cassette and the baseplate against the door.

In an embodiment, when the open end is closed by the door, the biasing member pushes the wafer cassette against the baseplate.

In an embodiment, the biasing member includes a first end, a second end opposite the first end, a first elastic bend, and a second elastic bend. The first end is connected to the second end via the first elastic bend and the second elastic bend.

In an embodiment, when the opening is closed by the door, the first end of the biasing member is in contact with the pod, and the second end of the biasing member is in contact with the wafer cassette.

In an embodiment, the compression of the biasing member decreases a bend angle of the first elastic bend and increases a bend angle of the second elastic bend.

In an embodiment, when the opening is closed by the door, the biasing member extends from the top wall of the wafer cassette to the closed end of the pod.

In an embodiment, the closed end of the pod includes an inward surface and a channel extending away from the inward surface of the closed end, and the biasing member includes a rib extending along a length of the biasing member. The biasing member is attached to the pod by the rib of the biasing member being disposed in the channel of the closed end.

In an embodiment, the baseplate includes a top and a projection extending from the top and the base of the wafer cassette includes a slot. When the opening is closed by the door, the projection extends into the slot to couple the wafer cassette and the baseplate.

In an embodiment, the baseplate includes a bottom with a notch and the door includes an inward surface and a projection extending from the inward surface. When the opening is closed by the door, the projection extends into the notch to couple the baseplate and the door.

In an embodiment, the projection of the door and the projection of the baseplate have the same shape.

In an embodiment, a size adaption system is configured to secure a wafer cassette within an internal space of a closed pod. The internal space is defined by one or more side walls, a closed end, and an open end that is closed with a door of the closed pod. The size adaption system includes a baseplate configured to be disposed in the internal space between the wafer cassette and the door and a biasing member configured to be disposed in compression between the wafer cassette and a closed end of the pod in the internal space. The compressed biasing member is configured to push the wafer cassette and the baseplate against the door.

The baseplate has a top, a bottom, and at least one of a projection extending from a top of the baseplate and a notch in the bottom of the baseplate. The projection is configured to extend into a slot of the wafer cassette to couple the baseplate to the wafer cassette. The notch is configured to receive a projection of the door to couple the baseplate and the door.

In an embodiment, the baseplate includes the notch.

In an embodiment, the baseplate includes the projection and the notch.

DRAWINGS

Like numbers represent like features.

DETAILED DESCRIPTION

This disclosure generally relates to securing a wafer cassette within a wafer pod of a wafer container. The wafer container used for carrying substrates, such as, during semiconductor manufacturing. For example, substrates in the form of wafers can be processed to form semiconductor devices. More specifically, this disclosure relates to a system with a baseplate and a biasing member for securing a wafer cassette within a wafer pod. In some embodiments, a wafer container when assembled includes the baseplate and the biasing member for securing a smaller wafer cassette with larger wafer pod.

Figure 1:
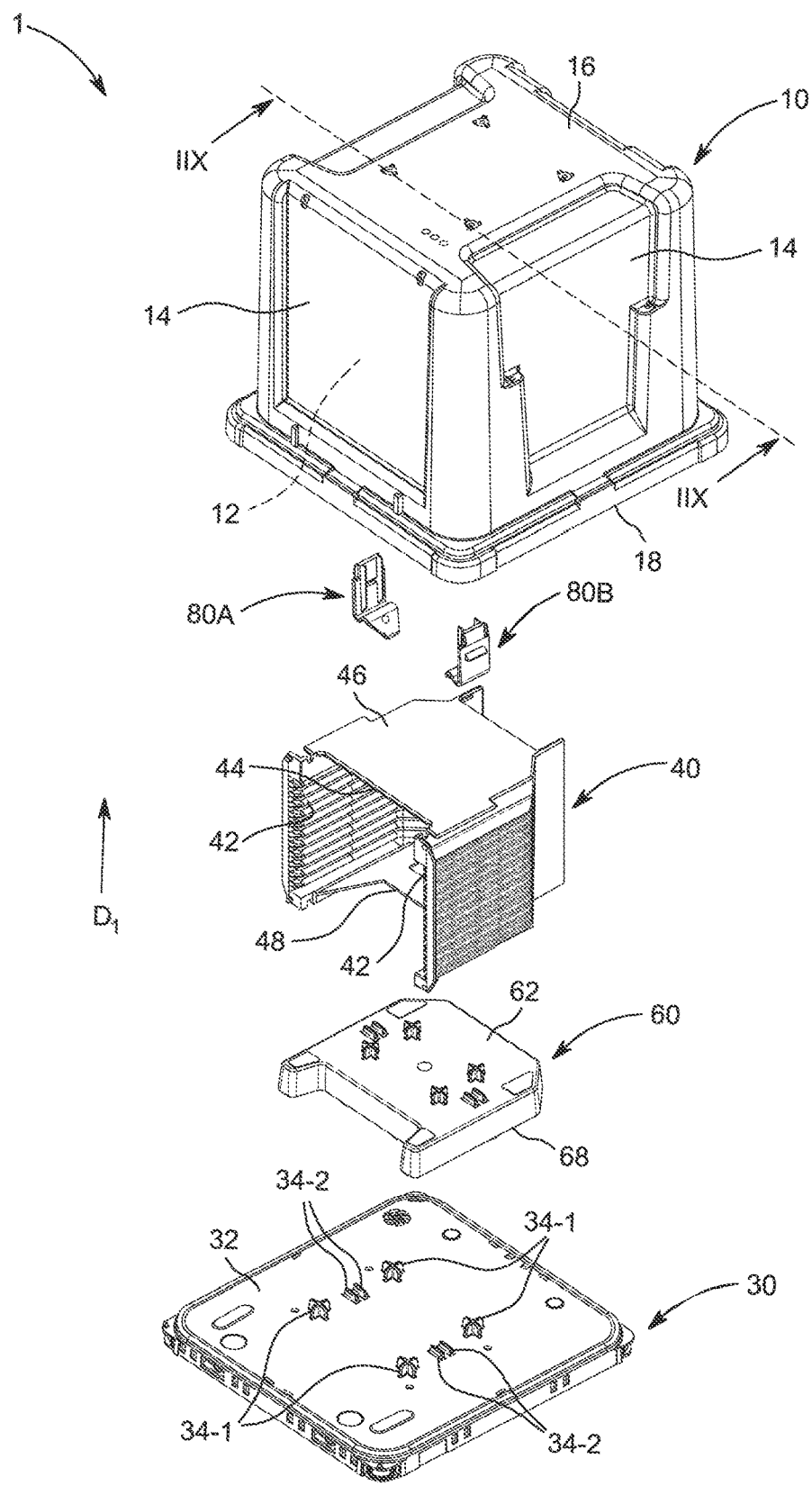
FIG. 1 is an exploded view of an embodiment of a wafer container.

FIG. 1 is an exploded view of an embodiment of a wafer container 1. The wafer container 1 includes a pod 10, a door 30, a wafer cassette 40, a baseplate 60, and biasing members 80A, 80B. When assembled, the wafer cassette 40 is contained within an internal space 12 defined by the pod 10 and the door 30.

In an embodiment, a size adaption system includes the baseplate 60 and the one of more biasing members 80A, 80B. The size adaption system is configured to secure the wafer cassette within the pod 10. The baseplate 60 is configured to limit horizontal movement of the wafer cassette 40 relative to the pod 10 while the one or more biasing members 80A, 80B are configured to limit vertical movement of the wafer cassette 40 relative to the pod 10. The size adaption system may be used to adapt a pod (e.g., the pod 10) for securely and safely transporting a smaller wafer cassette (e.g., the wafer cassette 40) within the pod. For example, a pod may be configured to securely and safely transport a first size of wafer cassette, and the size adaption system can be used to adapt the pod for securely and safely transport a second smaller sized wafer cassette (e.g., the second wafer cassette have a smaller size than the first wafer cassette).

The wafer container 1 can be any such suitable container for holding one or more wafers, for example, a standard mechanical interface (SMIF) pod. The wafer container 1 can be used to hold one or more wafers (not shown), for example, during processing, transport, and/or storage of semiconductor wafers.

The wafer cassette 40 is a container with an internal space configured to accommodate one or more wafers (not shown) such as semiconductor wafers. The one or more wafers can each be held in one or more wafer supports that extend from the walls of the wafer cassette 40. For example, the wafer cassette 40 can include a plurality of shelves 42 that are each configured to support a respective wafer. In an embodiment, the pod 40 is configured to hold a first wafer cassette (not shown) with shelves configured to hold wafers of a first size (e.g., 200 mm wafers, etc.), and the wafer cassette 40 is configured to hold wafer of a smaller size (e.g., 150 mm wafers, etc.).

The pod 10 includes one or more side walls 14, a closed end 16, and an open end 18 (obscured in FIG. 1) opposite to the closed end 16. The one or more side walls 14 can be any number and arrangement of side walls forming a continuous wall such that the one or more side walls 14 can define an internal space 12 along with the closed end 16 when the open end 18 is closed by the door 30. In an embodiment, there is one side wall 14 that is a continuous, curved wall.

In an embodiment, the one or more side walls 14 are four side walls, forming a rectangular or square shape. When the door 30 is attached and closes the open end 18, the pod 10 and door 30 define the internal space 12 configured to accommodate the wafer cassette 40, baseplate 60, and biasing members 80A, 80B.

The door 30 is configured to close the open end 18 of pod 10. The door 30 can have a shape generally similar to that defined by the one or more side walls 14 of pod 10. The door 30 can include one or more engagement features to join the door 30 to pod 10 to enclose the wafer container 1 (e.g., enclose the internal space 12). The door 30 can have a plane defined by its length and width directions. The internal configuration of the assembled wafer container 1 is discussed in more detail below.

The door 30 includes an inward surface 32. The inward surface 32 of the door 30 faces towards the internal space 12 of the wafer container 1 when the pod 10 is closed with the door 30. The inward surface 32 can face towards the closed end 16 of the pod 10. The door 30 includes projections 34-1 that extend from the inward surface 32 of the door 30. When the pod 10 is closed with the door 30, the projections 34-1, 34-2 extend from the inward surface 32 into the internal space 12. For example, the projections 34-1, 34-2 can extend in an upward direction from the inward surface 32 (e.g., extend in the vertical direction $D_1$ towards the closed end 16 of the pod 10).

In an embodiment, the projections 34-1, 34-2 are configured to directly engage with a larger sized wafer cassette (not show) than the wafer cassette 40. For example, said larger sized wafer cassette can have a larger width than the wafer cassette 40 for carrying wafers having a larger width than the wafer cassette 40 (e.g., the larger sized wafer cassette sized for carrying 200 mm wafers while the wafer cassette 40 is sized for carrying smaller wafers such as 150 mm wafers, 100 mm wafer, etc.). When the wafer container 1 is assembled, the baseplate 60 is coupled with the door 30 via at least one projection 34-1 of the door 30. In an embodiment, the door 30 may include one or more of the projections 34-1, 34-2. The coupling of the door 30 and the baseplate 60 is discussed in more detail below.

The wafer cassette 40 includes a top wall 44 and a base 48 opposite to the top wall 44. The top wall 44 and the base 48 can define the top and bottom, respectively, of the wafer cassette 40. The top wall 44 includes an upper surface 46. When the wafer container 1 is assembled, the upper surface 46 of the top wall 44 of the wafer cassette 40 faces towards the closed end 16 of the pod 10. For example, the upper surface 46 of the top wall 44 faces in the vertical direction $D_1$.

Figure 2:
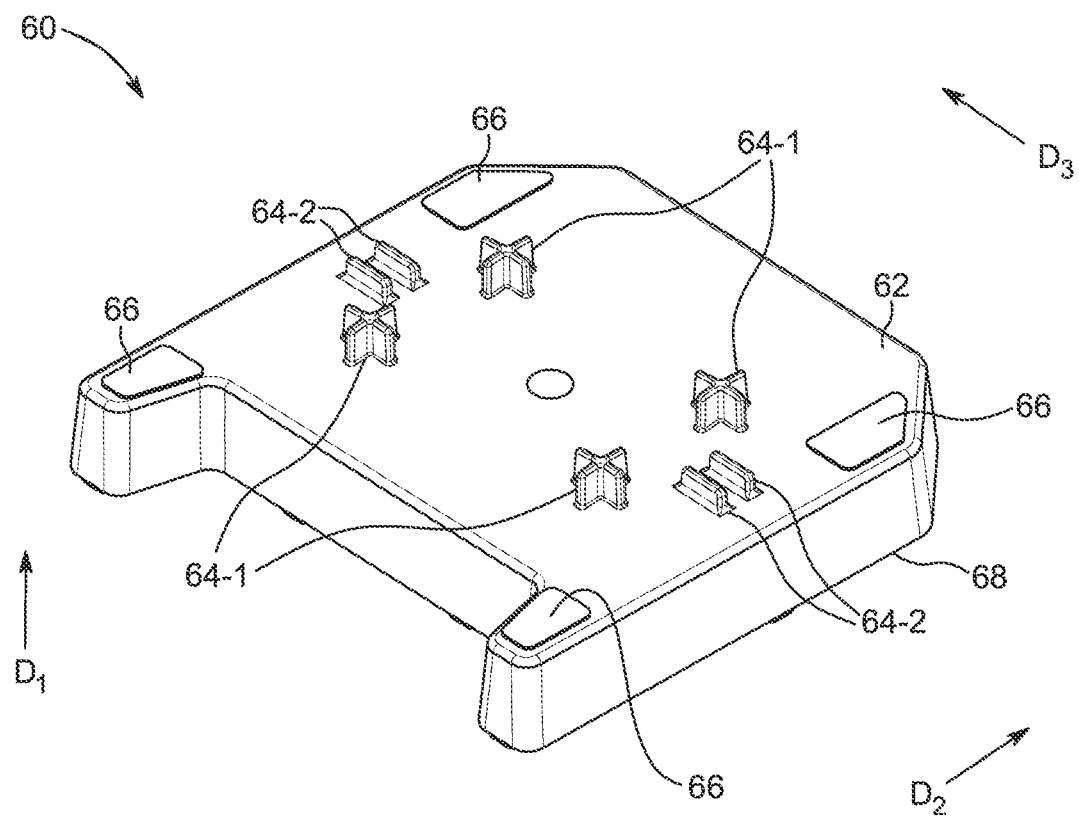
FIG. 2 is a top perspective view of an embodiment of a baseplate for a wafer container.

FIG. 2 is a top perspective view of the baseplate 60, according to an embodiment. The baseplate 60 includes a top 62 and a bottom 68 (obscured in FIG. 1) opposite the top 62. The baseplate 60 includes projections 64-1, 64-2 that extend from the top 62 of the of the baseplate 60. Each of the projections 64-1, 64-2 extend upwards from the top 62 of the baseplate 60 (e.g., in the vertical direction $D_1$). In an embodiment, one or more of the projection 34-1 of the door 30 and have the same shape as one or more of the projections 64-1 of the baseplate 60 (e.g., see FIG. 1). In an embodiment, the baseplate 60 may include one or more projections 64-1, 64-2.

As shown in FIG. 2, the top 62 of the baseplate 60 can also include one or more pads 66 for supporting the wafer cassette 40. The pads 66 can be affixed to an upper surface of the baseplate 60. When the wafer container 1 is assembled, the base 48 of the wafer cassette 40 rests on the one or more pads 66 of the top 62 of the baseplate. For example, the pads 66 can provide uppermost support surfaces of the baseplate 60 (excluding the projections 64-1, 64-2). The pads 66 can provide cushioning so as to reduce downward forces applied to wafer cassette 40 and any wafers container therein.

Figure 3:
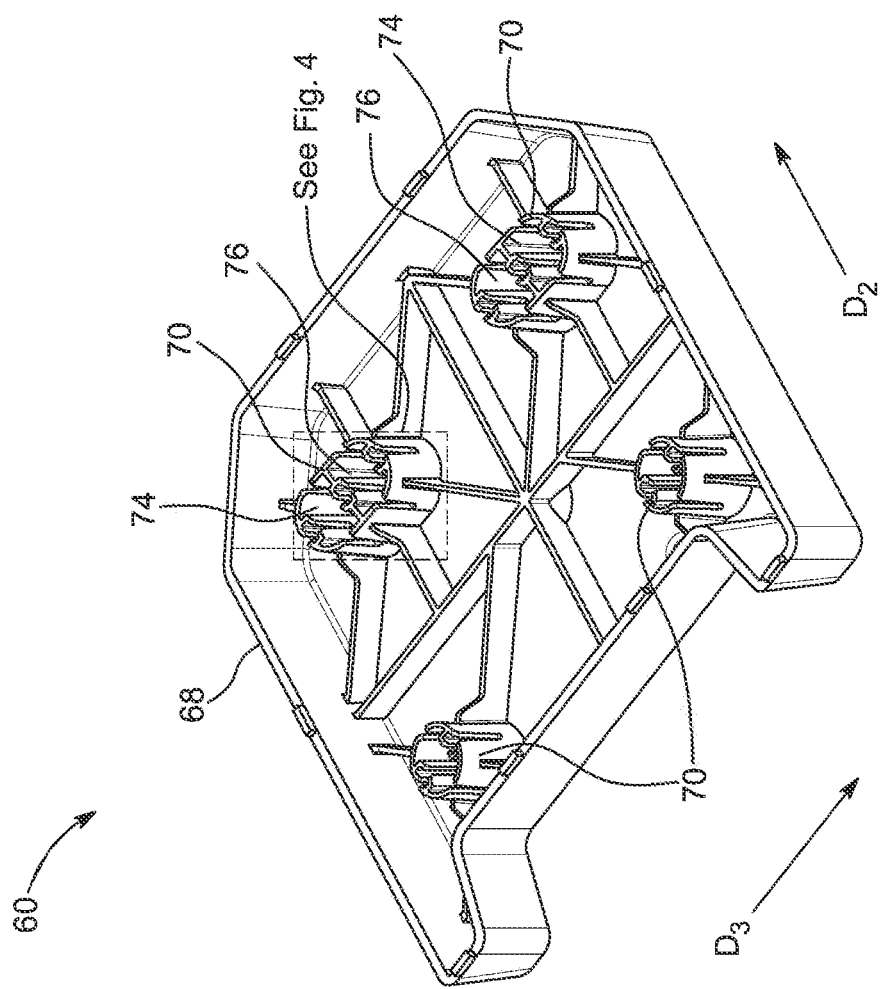
FIG. 3 is a bottom perspective view of the baseplate in FIG. 2, according to an embodiment.

FIG. 3 is a perspective view of the bottom 68 of the baseplate 60. The baseplate 60 includes one or more connectors 70 formed in the bottom 68 of the baseplate 60. The one or more connectors 70 are configured to engage with the one or more projections 34-1 of the door 30 to couple the door 30 and the baseplate 60. In an embodiment, each connector 70 is configured to engage with a respective projection 34-1 of the door 30.

Figure 4:
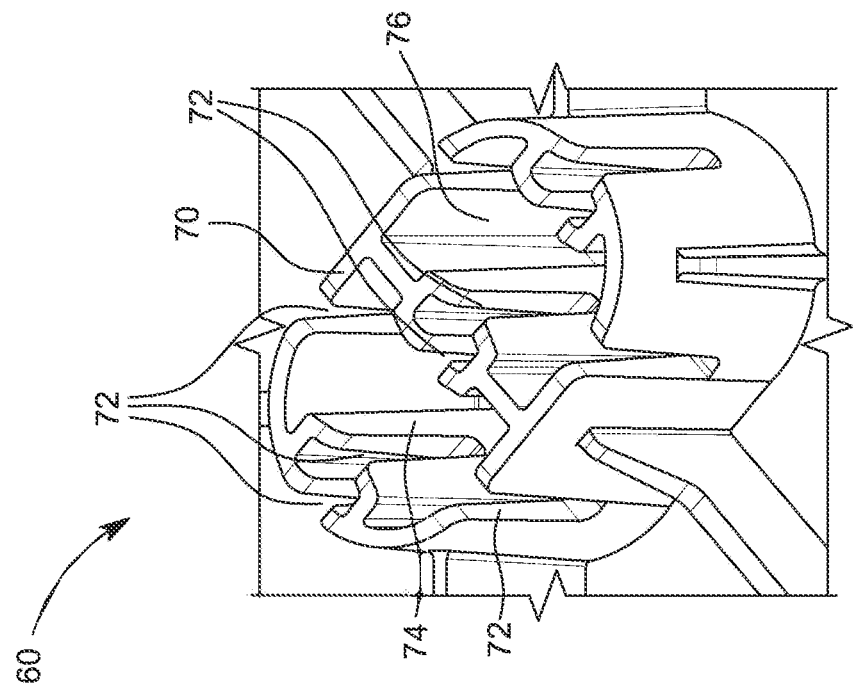
FIG. 4 is enlarged view of a portion of the baseplate in FIG. 2, according to an embodiment.

FIG. 4 is an enlarged view of one of the connectors 70 in FIG. 3. The bottom 68 of the baseplate 60 includes notches 72. The notches 72 are formed in the connectors 70. The notches 72 are each configured to receive a projection 34-1 to couple the door 30 and the baseplate 60. The connector 70 engages with its respective projection 34-1 by the projection 34-1 extending into at least one of the notches 72 of said connector 70. When the wafer container 1 is assembled, said respective projection 34-1 extends into at least one of the notches 72 and couples the projection 34-1 with said at least one notch 72. As shown in FIG. 4, the connector 70 in this embodiment includes six notches 72 for engaging with its respective projection 34-1. In an embodiment, a connector 70 may include one or more notches 72. In an embodiment, the connector 70 may include a single notch 72. In an embodiment, the connector 70 may include two notches 72 that are arranged perpendicular to each other (e.g., for limiting movement along both the horizontal direction $D_2$ and the perpendicular horizontal direction $D_3$).

When the wafer container 1 is assembled, the door 30 and the baseplate 60 are coupled together by engagement of the one or more connectors 70 with one or more of the projections 34-1, respectively. In particular, the door 30 and the baseplate 60 are transversely coupled by the engagement of at least one connector 70 with its respective projection 34-1 of the door 30. Transverse coupling between the door 30 and the baseplate 60 is coupling that limits sliding movement between the door 30 and the baseplate 60. For example, the transverse coupling provided by the connectors 70 limits movement between the door 30 and the baseplate 60 in at least one horizontal direction (e.g., in the horizontal $D_2$ direction, in the horizontal direction $D_3$, etc.). In an embodiment, the connectors 70 are configured to limit movement between the door 30 and the baseplate 60 along each of the horizontal direction $D_2$ and the second horizontal direction $D_3$. In an embodiment, at least one of the connectors 70 is configured to engage with its respective projection 34-1 of the door 30 so as to limit movement between the door 30 and the baseplate 60 along each of the horizontal direction $D_2$ and the second horizontal direction $D_3$.

As shown in FIG. 4, the notches 72 can have a width that gradually decreases over the length of the notch 72. For example, the width of a notch 72 gradually narrows from its opening. When the baseplate 60 is pushed against the door 30, a projection 34-1 is pushed into at least one notch 72 of its corresponding connector 70. The shape of the notch 72 is configured to cause the projection 34-1 to be wedged into said at least one notch 72 when the baseplate 60 is pushed against the door 30. The one or more projections 34-1 being wedged into their corresponding one or more notches 72 can advantageously retain the baseplate 60 on the door 30 and prevent unintended removal (e.g., decoupling, etc.) of the baseplate 60 from the door 30. For example, this can prevent the baseplate 60 from being accidently removed with the wafer cassette 40 when the wafer cassette 40 is lifted off of the baseplate 60.

The positions of the projections 34-1 may vary among different embodiments of the door 30. For example, the rear pair of projections 34-1 as shown in FIG. 2 are in a first position. In another embodiment, the rear pair of projections 34-1 can have a second position in which the projections are further spaced apart (e.g., the rear pair of the projections 34-1 in FIG. 2) being further spaced apart in the horizontal direction $D_3$).

As shown in FIGS. 3 and 4, a pair of the connectors 70 (e.g., the rear pair of connectors 70) can each include a first opening 74 and a second opening 76. Each of the openings 74, 76 is formed with at least one notch 72. Each opening 74, 76 in a connector 70 can include two or more notches 72, and at least one of the notches 70 can be shared by the openings 74, 76.

The pair of first openings 74 are positioned closer to each other than the pair of second openings 76 (e.g., the distance between the two first openings 74 in the horizontal direction $D_1$ is smaller than the distance between the two second openings 76 in the horizontal direction $D_1$). The first openings 74 are positioned such that they engage with a door that has a rear set of projections in the first position (e.g., the projections 34-1 as positioned in FIG. 2). The second openings 76 are positioned such that they engage with a door that has a rear pair of projections in the second position (e.g., an embodiment of a door having projections 34-1 spaced further apart in the horizontal direction $D_3$ than shown in FIG. 2). The two pairs of openings 74, 76 allow the baseplate 60 to be used with two different embodiments of the door 30 (e.g., a first door embodiment with narrow spaced projections, a second door embodiment with wider spaced projections).

Figure 5B:
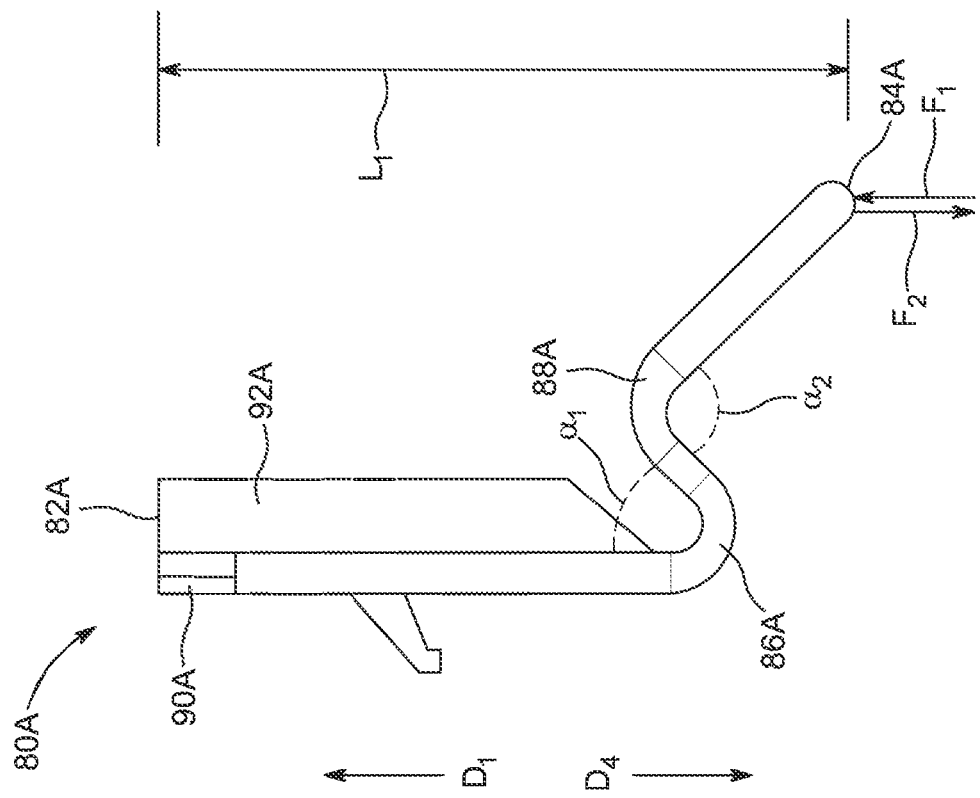
FIG. 5B is a side view of the biasing member in FIG. 5A, according to an embodiment.
Figure 5A:
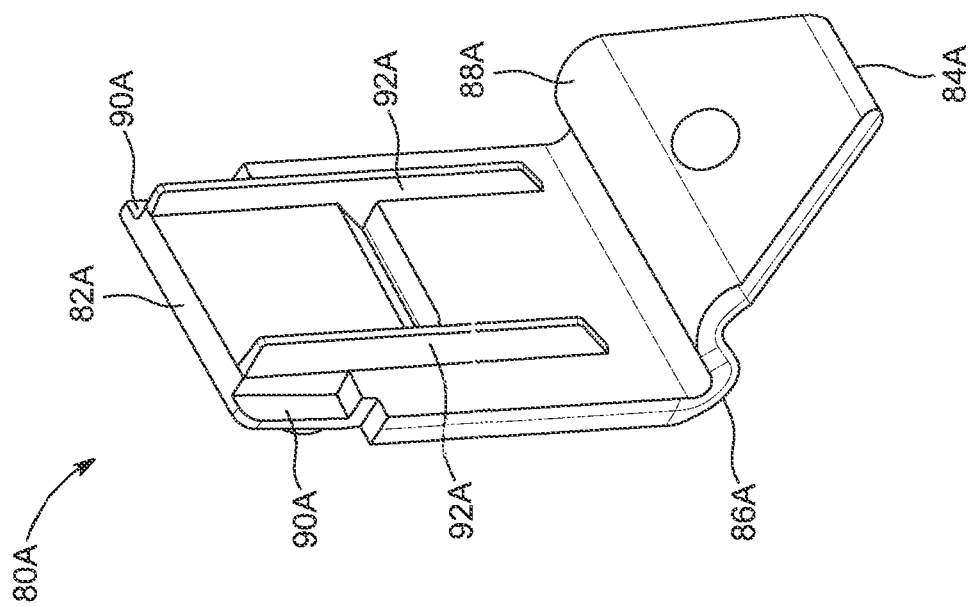
FIG. 5A is a front perspective view of an embodiment of a biasing member for a wafer container.

FIG. 5A is a front perspective view of an embodiment of a biasing member 80A. FIG. 5B is a side view of the biasing member 80A. The biasing member 80A includes a first end 82A, a second end 84A, a first elastic bend 86A, and a second elastic bend 88A. The second end 84A is opposite the first end 82A along the length $L_1$ of the biasing member 80A. The length $L_1$ of the biasing member 80A extend from its first end 82A to its second end 84A. When attached to the pod 10, the length $L_1$ of the biasing member 80A extends along the vertical direction $D_1$.

The first end 82A is connected to the second end 84A via the first elastic bend 86A and the second elastic bend 88A. For example, the first end 82A is connect to the second end 84A via the first elastic bend 86A and the second elastic bend 88A in series. The first elastic bend 86A is between the first end 82A and the second elastic bend 88A. The second elastic bend 88A is between the first elastic bend 86A and the second end 84A.

The first elastic bend 86A has a bend angle $\alpha_1$ and the second elastic bend 88A has a bend angle $\alpha_2$. The biasing member 80A is configured to be compressed when its second end 84A is pushed upwards. For example, the biasing member 80A is configured to be compressed by a force $F_1$ applied in the vertical direction $D_1$ to its second end 84A. The length $L_1$ of the biasing member 80A becomes shorter as its compressed. The compression decreases the bend angle $\alpha_1$ of the first elastic bend 86A and increases the bend angle $\alpha_2$ of the second elastic bend 88A. In an embodiment, the biasing member 80A compresses by folding its first elastic bend 86A and a straightening its second elastic bend 88A. The biasing member 80A is made of a resilient, flexible polymer. The polymer of the biasing member 80A is configured to allow flexing of the elastic bends 86A, 88A while also having a resiliency that returns the elastic bends 86A, 88A to their respective original shapes when the biasing member 80A is no longer being uncompressed (e.g., to original bend angle $\alpha_1$, to original bend angle $\alpha_2$, etc.). The biasing member may be made of, for example but not limited to, polycarbonate. In an embodiment, the entire biasing member 80A may be formed from (e.g., molded from) a single material.

The biasing member 80A is configured to be push downwards when compressed. For example, the second end 84A of the compressed biasing member 80A applies a force $F_2$ in the downward vertical direction $D_4$. The downward vertical direction $D_4$ is opposite to the upward vertical direction $D_1$. For example, the downward force $F_2$ is caused by the tensioned elastic bends 86A, 88A trying to return to their uncompressed shapes.

The biasing member 80A includes at least one rigid support 92A that extend along a length $L_1$ of the biasing member 80A. The at least one rigid support 92A can be provided between the first end 82A and the first elastic bend 86A. The portion of the biasing member 80A extending from the first end 82A to the first elastic bend 86A includes the at least one rigid support 92A and is configured to be rigid. For example, said portion of the biasing member 80A is configured to have a rigid structure and not bend when the biasing member 80A is being compressed. In an embodiment, the biasing member 90A may be made from a single material (e.g., molded from a single material) and the one or more rigid supports 92A can provide the rigidity to the portion of the biasing member 90A.

The biasing member 80A also includes a pair of ribs 90A. The ribs 90A are on opposite sides of the biasing member 80A and extend along the length $L_1$ of the biasing member 80A. The ribs 90A can be provided at the first end 82A of the biasing member 80A. The ribs 90A are located between the first end 82A and the first elastic bend 86A of the biasing member 80A. The ribs 90A are each configured to slid into a respective channel 22A (shown in FIGS. 7 and 8) of the pod 10. The biasing member 80A can be attached to the pod 10 by each of the ribs 90A being disposed in a respective channel 22A of the pod 10. The attachment of the biasing member 80A is discussed in more detail below.

Figure 6:
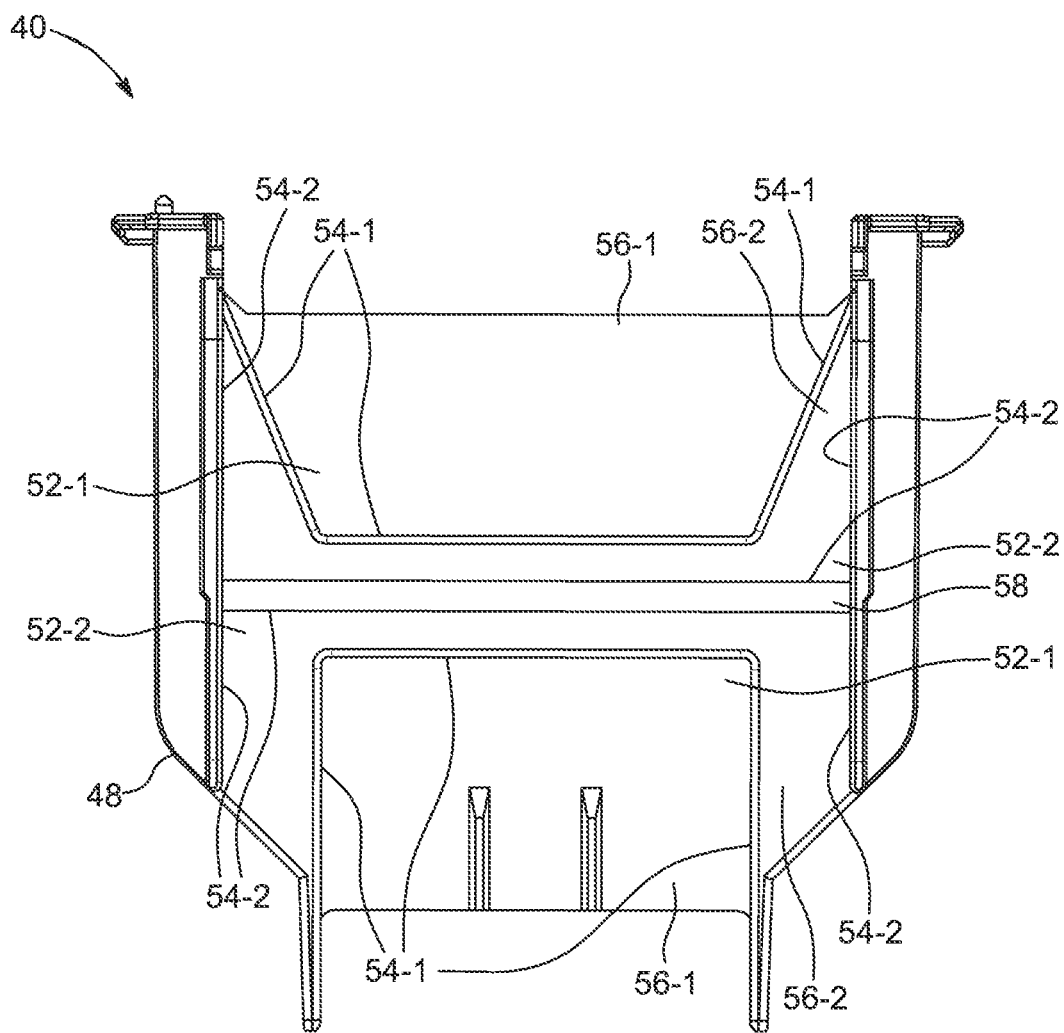
FIG. 6 is a bottom view of an embodiment of a wafer cassette for a wafer container.

FIG. 6 is a bottom view of the wafer cassette 40. The base 48 of the wafer cassette 40 includes a lower surface 50 and slots 52-1, 52-2. The slots 52-1, 52-2 are formed in the bottom of the wafer cassette 40. The slots 52-1, 52-2 are formed by one or more sidewalls. In this embodiment, the wafer cassette 40 includes two first slots 52-1 and two second slots 52-1. Each first slot 52-1 is defined by a plurality of sidewalls 54-1 that extend from a lower surface 50 of the baseplate 48. As shown in FIG. 6, each slot 52-1 can also include an open side 56-1. For example, along a horizontal plane, each first slot 52-1 is surrounded by a plurality of sidewalls 54-1 and an open side 56-1.

Each second slot 52-2 is defined by a plurality of sidewalls 54-2. As shown in FIG. 6, each slot 52-2 can also include an open side 56-2. For example, along a horizontal plane, each first slot 52-2 is surrounded by a plurality of sidewalls 54-2 and an open side 56-2. The base 48 can include a protrusion 58 that provides at least one of the sidewalls 54-2 of each of the two second slots 52-2 (e.g., the protrusion 58 provides a sidewall 54-2 of a first one of the second slots 52-2 and a sidewall 54-2 of a second one of the second slots 52-2). In an embodiment, the protrusion 58 may be a vertically extending wall between the slots 52-2. First slot 52-1 and second slot 52-2 may overlap in the vertical direction (e.g., along a direction into the page of FIG. 6, along the vertical direction $D_1$ in FIG. 1).

Figure 7:
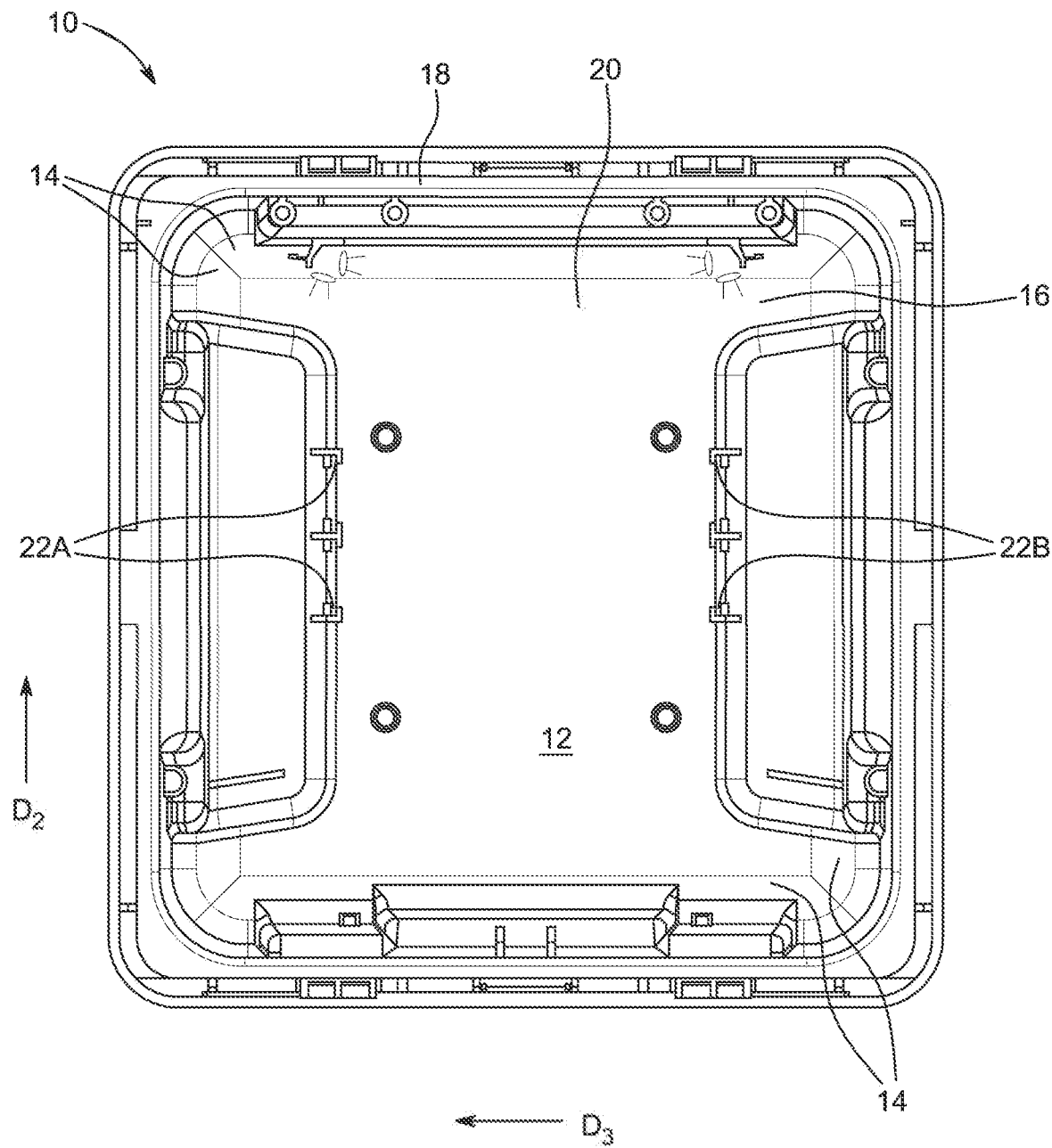
FIG. 7 is a bottom view of an embodiment of the pod for a wafer container.

FIG. 7 is a bottom view of the pod 10. The pod 10 includes the closed end 16, the open end 18, and the one or more side walls 14. The pod 10 can also include channels 22A, 22B for attaching the biasing members 80A, 80B to the pod 10. The closed end 16 of the pod 10 includes an inward surface 20 and the channels 22A, 22B. The inward surface 20 faces the interior space 12 of the wafer container 1. Each of the channels 22A, 22B extends from the inward surface 20 of the closed end 16. For example, each channel 22A, 22B can extend from the inward surface 20 of the closed end 16 in the vertical direction $D_4$ towards the open end 18 of the pod 10 (e.g., see FIG. 8).

The pod 10 can include a pair of channels 22A for the first biasing member 80A and a pair of channels 22B for the second biasing member 80A. For example, each rib 90A of the biasing member 80A is disposed in a respective one of the channels 22A. The biasing member 80A can be attached to the pod 10 by sliding its first end 82A between the two channels 22A. Each rib 90A at the first end 82A of the biasing member 80A slides into its respective channel 22A. The first end 82A of the biasing member 80A disposed between its corresponding pair of channels 22A. The biasing member 80A has at least one rib 90A disposed in its respective slot 22A in the pod 10 to couple the biasing member 80A and the pod 10. In an embodiment, the biasing member 80A is held in the channels 22A by being press fit between the two channels 22A.

The attachment provided by the channels 22A can be configured to limit sliding movement between the first end 82A of the biasing member 80A and closed end 16 of the pod 10. For example, the attachment provided by channels 22A, 22B can limit horizontal movement between first end 82A of the biasing member 80A and the closed end 16 of the pod 10 (e.g., in the horizontal direction $D_2$, in the second horizontal direction $D_3$, etc.). The attachment between the channels 22A and their respective biasing member 80A can also be configured to retain the biasing member 80A on the pod 10 when the biasing member 80A is no longer being compressed (e.g., when the pod 10 is opened to remove the wafer cassette 40 from the wafer container 1, etc.).

Figure 8:
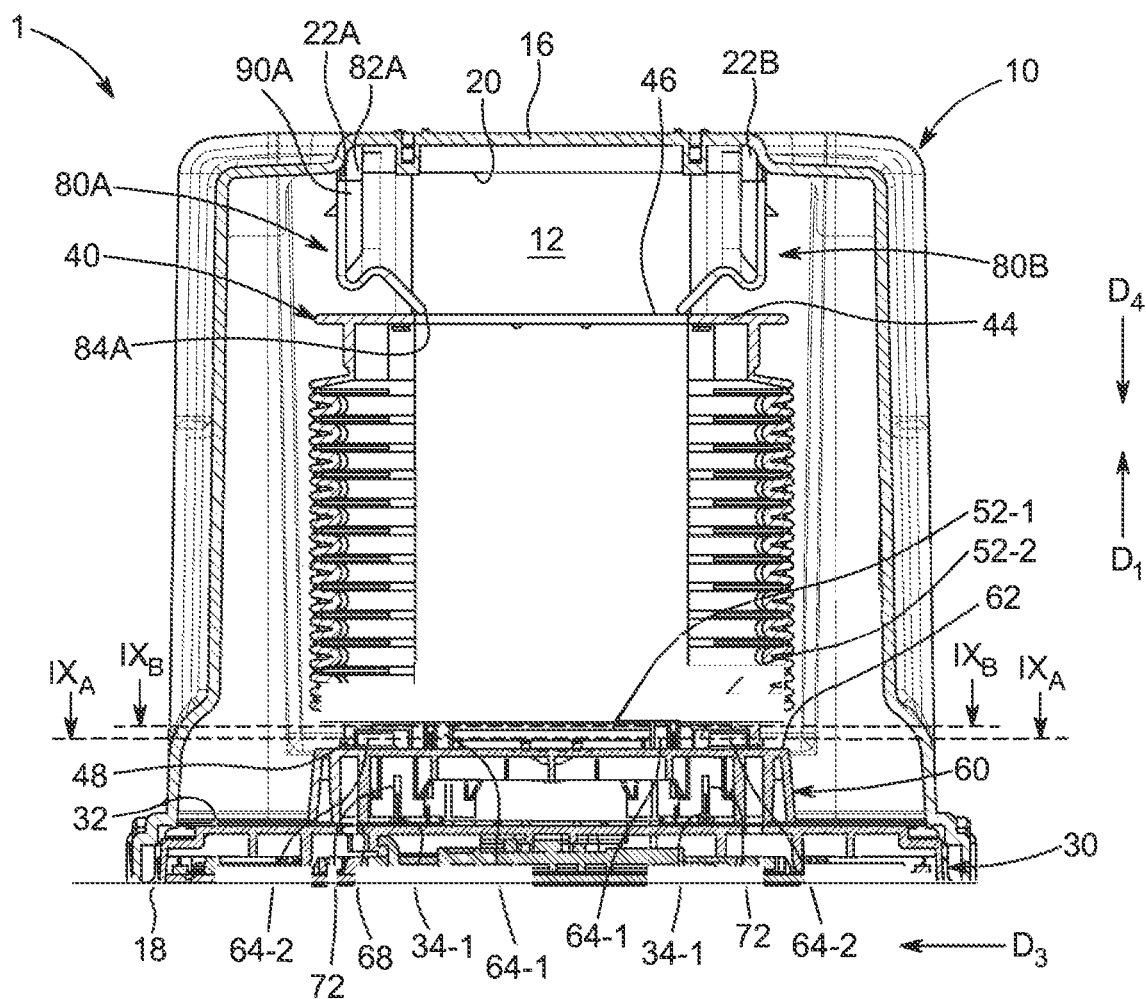
FIG. 8 is a cross-sectional view of the wafer container in FIG. 1, according to an embodiment.

FIG. 8 is a cross-sectional view of the wafer container 1. The cross-section in FIG. 8 is along the line IIX-IIX in FIG. 1 (when the wafer container 1 is assembled). When assembled, the open end 18 of the pod 10 is closed with the door 30, and the wafer cassette 40, baseplate 60, and biasing members 80A, 80B are contained within the internal space 12. The door 30 can seal the open end 18 of the pod 10 and enclose the internal space 12. The wafer cassette 40 is stacked on the baseplate 60 and the door 30 and is located between the baseplate 60 and the compressed one or more biasing members 80A, 80B. The baseplate 60 is stacked on the door 30 and is located between the door 30 and the wafer cassette 40. The base 48 of the wafer cassette 40 contacts the top 62 of the baseplate 60, and the bottom 68 of the baseplate 60 contacts the inward surface 32 of the door 30. For example, the outer walls of the bottom 68 of the baseplate 60 may contact the inward surface 32 of the door 30.

When the wafer container 1 is assembled, the projections 64-1, 64-2 each extend towards the closed end 16 of the pod 10. Each projection 64-1, 64-2 is configured to be extend into a one of the slots 52-1, 52-2 (shown in FIGS. 6 and 8) in the base 48 of the wafer cassette 40. The engagement of the projections 64-1, 64-2 with their respective slot 52-1, 52-2 couples the baseplate 60 with the wafer cassette 40. In particular, the projections 64-1, 64-2 extending into their respective slot 52-1, 52-2 transversally couples the wafer cassette 40 and the baseplate 60. Transverse coupling between the wafer cassette 40 and the baseplate 60 is coupling that limits sliding movement between the wafer cassette 40 and the baseplate 60. For example, the transverse coupling provided by the projections 64-1, 64-2 limits movement between the wafer cassette 40 and the baseplate 60 in at least one horizontal direction (e.g., in horizontal direction $D_2$, in horizontal direction $D_3$ perpendicular to the horizontal direction $D_2$, etc.). In an embodiment, the projections 64-1, 64-2 are configured to limit movement between the wafer cassette 40 and the baseplate 60 along each of the horizontal direction $D_2$ and the second horizontal direction $D_3$. In an embodiment, one of the projections 64-1 and its respective slot 52-1 is configured to limit movement along each of the horizontal direction $D_2$ and the second horizontal direction $D_3$. As shown in FIG. 8, a first projection 34-1 can extend through the slot 52-2 for a second projection 64-1 to reach its respective slot 52-1.

As shown in FIG. 8, the projections 34-1 of the door 30 do not vertically align with the slots 52-1 in the wafer cassette 40 (e.g., the projections 34-1 would not fit into slots 52-1, the projections 34-1 would not abut sidewall(s) of the slot 52-1 so as to prevent horizontal movement). For example, pod 10 may be originally designed to be used with a larger wafer cassette than the wafer cassette 40. The larger wafer cassette having a width (e.g., in the horizontal direction $D_3$) that is larger than the wafer cassette 40. The scaling down of the wafer cassette 40 from the larger wafer cassette results in at least one of the slots 52-1 no longer being aligned with its corresponding projection 34-1. The baseplate 60 and one or more biasing members 80A, 80B are configured to secure the wafer cassette 40 within the pod 10 and door 30 having a configuration incompatible for properly securing the wafer cassette 40 within the internal space 12 of the wafer container 1.

For simplicity, the description below is directed to the first biasing member 80A. It should be appreciated that an embodiment of the wafer container 1 that includes the second biasing member 80B may have a similar configuration as described for the first biasing member 80A. In the illustrated embodiment, the two biasing members 80A, 80B can advantageously provide a more consistent downward pressure on the wafer cassette 40 along the horizontal plane. In another embodiment, the wafer container 1 may be configured to have a single biasing member 80A.

As shown in FIG. 8, the biasing member 80A is located between the wafer cassette 40 and the closed end 16 of the pod 10. The biasing member 80A extends from the upper surface 46 of the top wall 44 of the cassette 40 to the inward surface 20 of the closed end 16 of the pod 10. In the closed pod 10, the biasing member 80A is compressed between the top wall 44 of the wafer cassette 40 and the closed end 16 of the pod 10. The biasing member 80A in the assembled wafer container 1 is configured to be disposed in compression between the top wall 44 of the wafer cassette 40 and the closed end 16 of the pod 10.

The closing of the open end 18 of the pod 10 with the door 30 compresses the biasing member 80A. The height of the coupled wafer cassette 40 and baseplate 60 (e.g., in the vertical direction $D_1$) is greater than the vertical space between the second end 84A of the biasing member 80A (when uncompressed) and the closed door 30. When the door 30 is moved into its closed position as shown in FIG. 8 (e.g., moved vertically upward to seal the open end 18 of the pod 10), the stacked door 30, baseplate 60, and wafer cassette 40 are forced upward against the biasing member 80A and compress the biasing member 80A. The top wall 44 of the wafer cassette 40 pushes the second end 84A of the biasing member 80A vertically upwards (e.g., in the vertical direction $D_1$). The second end 84A is moved vertically upwards closer to the closed end 16 of the pod 10 and the biasing member 80A is compressed between the wafer cassette 40 and the closed end 16 of the pod 10.

The first end 82A of the biasing member 80A contacts the closed end 16 of the pod 10 and the second end 84A of the biasing member 80A contacts the top wall 44 of the wafer cassette 40. For example, the first end 82A contacts the inward surface 20 of the closed end 16 and the second end 84A contacts the upper surface 46 of the top wall 44 of the wafer cassette 40. The second end 84A contacts a flat surface of the wafer cassette 40 to minimize contact (e.g., contacts a flat portion of the upper surface 46 of the wafer cassette 40).

The compression tensions the biasing member 80A such that it applies a downward force (e.g., the downward force $F_2$ in FIG. 5B). The compressed biasing member 80A pushes downward on the top wall 44 of the wafer cassette 40. The compressed biasing member 80A pushes the wafer cassette 40 and the baseplate 60 against the inward surface 32 of the door 30. The compressed biasing member 80A pushes the wafer cassette 40 against the top 62 of the baseplate 60, which pushes the baseplate 60 against the inward surface 32 of the door 30. The wafer cassette 40 and the baseplate 60 are squeezed between the compressed biasing member 80A and the door 30 along the vertical direction (e.g., in the vertical direction $D_1$, in vertical direction $D_4$).

The downward force applied by the compressed biasing member 80A generally prevents upward movement of the wafer cassette 40 and the baseplate 60 (e.g., movement in the upward vertical direction $D_1$). The downward force by the compressed biasing member 80A is also configured to prevent the cassette 40 from being decoupled from the baseplate 60 and to prevent the baseplate 60 from being decoupled from the door 30. For example, the downward force is configured to prevent upward vertical movement of the cassette 40 that is large enough to pull the projections 64-1, 64-2 of the baseplate 60 out of their respective slots 52-1, 52-2 in the cassette 40. For example, the downward force is configured to prevent upward vertical movement of the cassette 40 and the baseplate 60 relative to the door 30 that is large enough to pull the projections 34-1 of the door 30 out of their respective one or more notches 72 in the baseplate 60.

As discussed above, the baseplate 60 is transversely coupled to the each of the wafer cassette 40 and the door 30. The baseplate 60 transversely couples the wafer cassette 40 to the door 30. The closed door 30 is joined to the pod 10 such that the baseplate 60 transversely couples the wafer cassette 40 relative to the pod 10 via the closed door 30. When the wafer container 1 is assembled, the baseplate 60 is able to advantageously limit horizontal movement of the wafer cassette 40 relative to the pod 10 (e.g., in the horizontal direction $D_2$, in horizontal direction $D_3$, etc.).

Figure 9A:
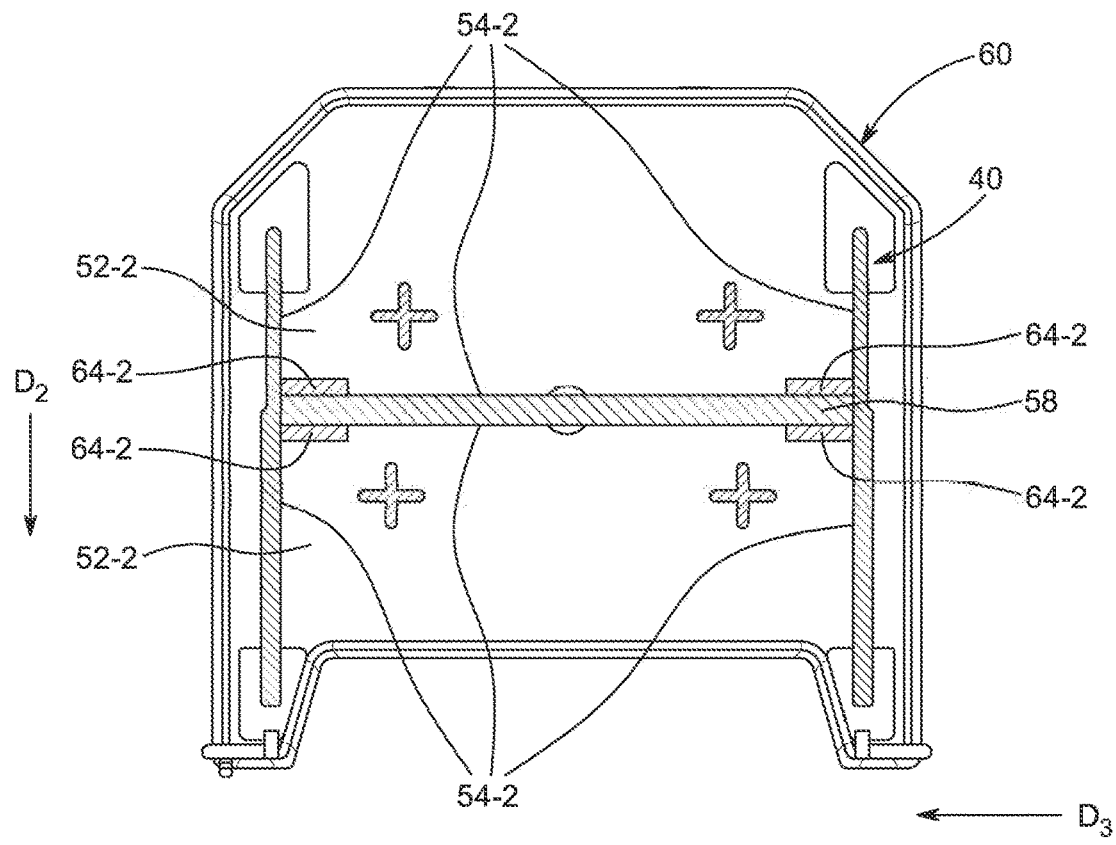
FIG. 9A is a cross-sectional view of the coupled baseplate and wafer cassette as indicated in FIG. 8, according to an embodiment.

FIG. 9A is a cross-sectional view of the coupled wafer cassette 40 and baseplate 60 in FIG. 8. The cross-sectional view in FIG. 9A is a horizontal cross-sectional view along the line $IX_4$-$IX_4$ in FIG. 8. The projections 64-2 of the baseplate 60 extend into the second slots 52-2 in the wafer cassette 40. Each of the projections 64-2 can be configured to contact at least one sidewall 54-2 of a second slot 52-2 in the wafer cassette 40. The contact between the projections 64-2 and the slots 52-2 prevents horizontal movement between the wafer cassette 40 and the baseplate 60 (e.g., in the first horizontal direction $D_2$, in the second horizontal direction $D_3$). As shown in FIG. 9A, the protrusion 58 of the wafer cassette 40 can fit into the space between a pair of the projections 64-2. The protrusion 58 can directly contract each of projections 64-2 in the pair. The protrusion 58 contacting each of the projections 64-2 in the pair so as prevent movement in at least one horizontal direction (e.g., in the horizontal direction $D_2$).

Figure 9B:
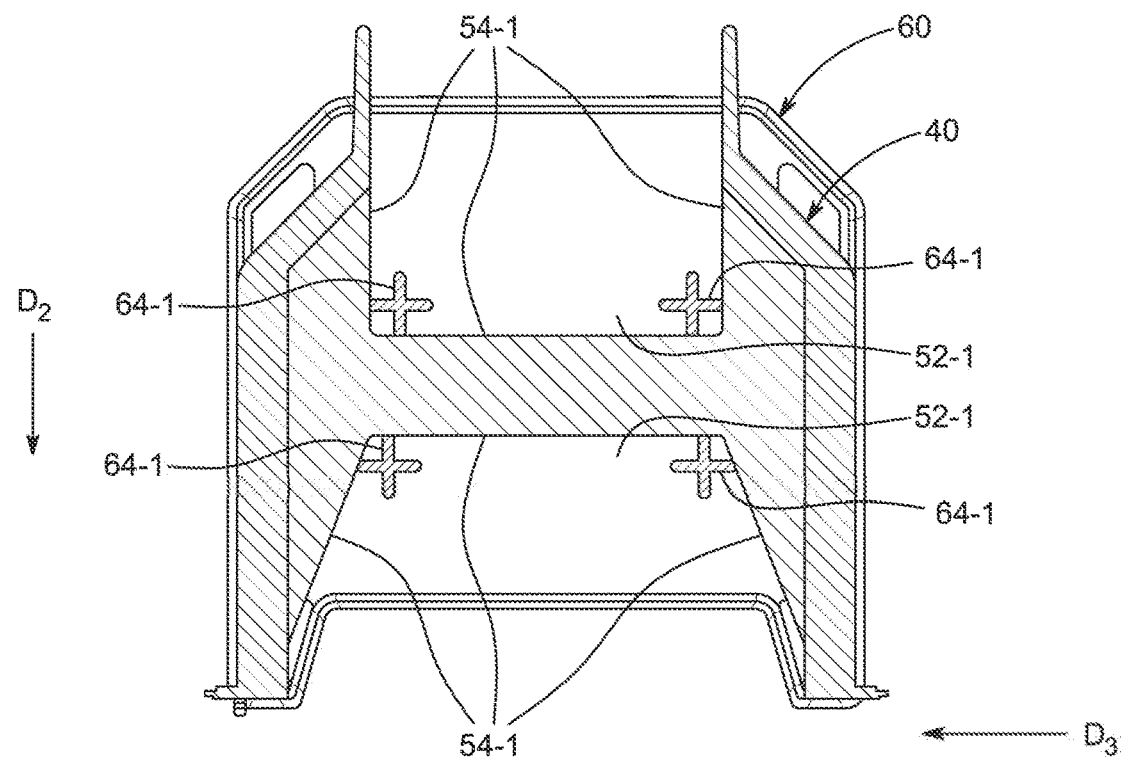
FIG. 9B is a cross-sectional view of the coupled baseplate and wafer cassette as indicated in FIG. 8, according to an embodiment.

FIG. 9B is a cross-sectional view of the coupled wafer cassette 40 and baseplate 60 in FIG. 8. The cross-sectional view in FIG. 9B is a horizontal cross-sectional view along the line $IX_B$-$IX_B$ in FIG. 8. The projections 64-1 of the baseplate 60 extend into the first slots 52-1 in the wafer cassette 40. Each of the projections 64-1 can be configured to contact at least one sidewall 54-1 of a first slot 52-1 in the wafer cassette 40. The contact between the projections 64-1 and the slots 52-1 prevents horizontal movement between the wafer cassette 40 and the baseplate 60 (e.g., sliding of the wafer cassette 40 on the baseplate 60, movement in the first horizontal direction $D_2$, movement in the second horizontal direction $D_3$). As shown in FIG. 9B, the second projections 62-1 are configured not extend into the first slots 52-1 of the wafer cassette 50. For example, as shown by FIGS. 9A and 9B, the first projections 64-1 can have a larger height (e.g., in the vertical direction $D_1$ as shown in FIG. 8) than the second projections 64-2. Generally, the compressed biasing member 80A is able to advantageously limit vertical movement of the wafer cassette 40 relative to the pod 10 while the baseplate 60 limits horizontal movement of the wafer cassette 40 relative to the pod 10. The biasing member 80A and baseplate 60 limiting movement of the wafer cassette 40 within the internal space 12 such that the wafer cassette 40 can be safely and securely transported within wafer container 1.

ASPECTS

Any of aspects 1-10 can be combined with any of aspects 11-18.

Aspect 1. A wafer container, comprising: a pod including one or more side walls, a closed end, an open end, and an internal space defined by the one or more side walls and the closed end; a door configured to close the open end of the pod; a wafer cassette including a top wall; a baseplate; and a biasing member, wherein when the open end is closed by the door, the baseplate is located between the door and the wafer cassette, and the biasing member is compressed between the top wall of the wafer cassette and the closed end of the pod and pushes the wafer cassette and the baseplate against the door.

Aspect 2. The wafer container of aspect 1, wherein when the open end is closed by the door, the biasing member pushes the wafer cassette against the baseplate.

Aspect 3. The wafer container of any one of aspects 1 and 2, wherein the biasing member includes a first end, a second end opposite the first end, a first elastic bend, and a second elastic bend, the first end being connected to the second end via the first elastic bend and the second elastic bend.

Aspect 4. The wafer container of aspect 3, wherein when the opening is closed by the door, the first end of the biasing member is in contact with the pod, and the second end of the biasing member is in contact with the wafer cassette.

Aspect 5. The wafer container of any one of aspects 3 and 4, wherein the compression of the biasing member decreases a bend angle of the first elastic bend and increases a bend angle of the second elastic bend.

Aspect 6. The wafer container of any one of aspects 1-5, wherein when the opening is closed by the door, the biasing member extends from the top wall of the wafer cassette to the closed end of the pod.

Aspect 7. The wafer container of any one of aspects 1-6, wherein the closed end of the pod includes an inward surface and a channel extending away from the inward surface of the closed end, the biasing member includes a rib extending along a length of the biasing member, and the biasing member is attached to the pod by the rib of the biasing member being disposed in the channel of the closed end.

Aspect 8. The wafer container of any one of aspects 1-7, wherein the baseplate includes a top and a projection that extends from the top, the base of the wafer cassette includes a slot, and when the opening is closed by the door, the projection extends into the slot to couple the wafer cassette and the baseplate.

Aspect 9. The wafer container of any one of aspects 1-8, wherein the baseplate includes a bottom with a notch, the door includes an inward surface and a projection extending form the inward surface, and when the opening is closed by the door, the projection extends into the notch to couple the baseplate and the door.

Aspect 10. The wafer container of aspect 9, wherein the baseplate includes a top and a projection extending from the top, the base of the wafer cassette includes a slot, when the opening is closed by the door, the projection extends into the slot to couple the wafer cassette and the baseplate, and the projection of the door and the projection of the baseplate have the same shape.

Aspect 11. A size adaption system for securing a wafer cassette within an internal space of a closed pod, the internal space being defined by one or more side walls, a closed end, and an open end closed with a door of the closed pod, the size adaption system including: a baseplate having a top and a bottom, the baseplate configured to be disposed in the internal space between the wafer cassette and the door, the baseplate including at least one of: a projection extending from a top of the baseplate, the projection configured to extend into a slot of the wafer cassette to couple the baseplate to the wafer cassette, and a notch in the bottom of the baseplate, the notch configured to receive a projection of the door to couple the baseplate and the door; and a biasing member configured to be disposed in compression between the wafer cassette and a closed end of the pod in the internal space, the biasing member in compression pushing the wafer cassette and the baseplate against the door.

Aspect 12. The size adaption system of aspect 11, wherein the biasing member, when disposed in compression between the wafer cassette and the closed end of the pod in the internal space, is configured to push the wafer cassette against the baseplate.

Aspect 13. The size adaption system of any one of aspects 11 and 12, wherein the biasing member includes a first end, a second end opposite the first end, a first elastic bend, and a second elastic bend, and the first end being connected to the second end via the first elastic bend and the second elastic bend.

Aspect 14. The size adaption system of aspect 13, wherein the biasing member is configured to be disposed in compression between the wafer cassette and the closed end of the pod in the internal space such that the first end of the biasing member is in contact with the pod and the second end of the biasing member is in contact with the wafer cassette.

Aspect 15. The size adaption system of any one of aspects 13 and 14, wherein the biasing member is configured so that the compression decreases a bend angle of the first elastic bend and increases a bend angle of the second elastic bend.

Aspect 16. The size adaption system of any one of aspects 11-15, wherein the closed end of the pod includes an inward surface and a channel extending away from the inward surface of the closed end, and the biasing member includes a rib extending along a length of the biasing member, the biasing member being configured to attach to the pod by sliding the rib of the biasing member into the channel of closed end.

Aspect 17. The size adaption system of claim any one of aspects 11-16, wherein the baseplate includes the notch.

Aspect 18. The size adaption system of any one of aspects 11-17, wherein the baseplate includes the projection and the notch.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:

1. A wafer container, comprising:
    a pod including one or more side walls, a closed end, an open end, and an internal space defined by the one or more side walls and the closed end;
    a door configured to close the open end of the pod;
    a wafer cassette including a top wall;
    a baseplate; and
    a biasing member,
    wherein when the open end is closed by the door, the baseplate is located between the door and the wafer cassette, and the biasing member is compressed between the top wall of the wafer cassette and the closed end of the pod and pushes the wafer cassette and the baseplate against the door, wherein the baseplate includes a bottom with a notch, the door includes an inward surface and a projection extending from the inward surface, and when the opening is closed by the door, the projection extends into the notch to couple the baseplate and the door.

2. The wafer container of claim 1, wherein when the open end is closed by the door, the biasing member pushes the wafer cassette against the baseplate.

3. The wafer container of claim 1, wherein when the opening is closed by the door, the biasing member extends from the top wall of the wafer cassette to the closed end of the pod.

4. The wafer container of claim 1, wherein
    the closed end of the pod includes an inward surface and a channel extending away from the inward surface of the closed end, the biasing member includes a rib extending along a length of the biasing member, and
    the biasing member is attached to the pod by the rib of the biasing member being disposed in the channel of the closed end.

5. The wafer container of claim 1, wherein
    the baseplate includes a top and a projection extending from the top, the base of the wafer cassette includes a slot, and
    when the opening is closed by the door, the projection extends into the slot to couple the wafer cassette and the baseplate.

6. The wafer container of claim 1, wherein
    the baseplate includes a top and a projection extending from the top, the base of the wafer cassette includes a slot,
    when the opening is closed by the door, the projection extends into the slot to couple the wafer cassette and the baseplate, and
    the projection of the door and the projection of the baseplate have the same shape.

7. The wafer container of claim 1, wherein the biasing member includes a first end, a second end opposite the first end, a first elastic bend, and a second elastic bend, the first end being connected to the second end via the first elastic bend and the second elastic bend.

8. The wafer container of claim 1, wherein the compression of the biasing member decreases a bend angle of the first elastic bend and increases a bend angle of the second elastic bend.

9. The wafer container of claim 8, wherein when the opening is closed by the door, the first end of the biasing member is in contact with the pod, and the second end of the biasing member is in contact with the wafer cassette.

10. A size adaption system for securing a wafer cassette within an internal space of a closed pod, the internal space being defined by one or more side walls, a closed end, and an open end closed with a door of the closed pod, the size adaption system including:
    a baseplate having a top and a bottom, the baseplate configured to be disposed in the internal space between the wafer cassette and the door, the baseplate including at least one of:
        a projection extending from a top of the baseplate, the projection configured to extend into a slot of the wafer cassette to couple the baseplate to the wafer cassette, and
        a notch in the bottom of the baseplate, the notch configured to receive a projection of the door to couple the baseplate and the door; and
    a biasing member configured to be disposed in compression between the wafer cassette and a closed end of the pod in the internal space, the biasing member in compression pushing the wafer cassette and the baseplate against the door.

11. The size adaption system of claim 10, wherein the biasing member, when disposed in compression between the wafer cassette and the closed end of the pod in the internal space, is configured to push the wafer cassette against the baseplate.

12. The size adaption system of claim 10, wherein the biasing member includes a first end, a second end opposite the first end, a first elastic bend, and a second elastic bend, and the first end being connected to the second end via the first elastic bend and the second elastic bend.

13. The size adaption system of claim 12, wherein the biasing member is configured to be disposed in compression between the wafer cassette and the closed end of the pod in the internal space such that the first end of the biasing member is in contact with the pod and the second end of the biasing member is in contact with the wafer cassette.

14. The size adaption system of claim 12, wherein the biasing member is configured so that the compression decreases a bend angle of the first elastic bend and increases a bend angle of the second elastic bend.

15. The size adaption system of claim 10, wherein
    the closed end of the pod includes an inward surface and a channel extending away from the inward surface of the closed end, and the biasing member includes a rib extending along a length of the biasing member, the biasing member being configured to attach to the pod by sliding the rib of the biasing member into the channel of closed end.

16. The size adaption system of claim 10, wherein the baseplate includes the notch.

17. The size adaption system of claim 16, wherein the baseplate includes the projection and the notch.

\* \* \* \* \*